US006657232B2

(12) United States Patent
Morkoc

(10) Patent No.: US 6,657,232 B2
(45) Date of Patent: Dec. 2, 2003

(54) DEFECT REDUCTION IN GAN AND RELATED MATERIALS

(75) Inventor: Hadis Morkoc, Richmond, VA (US)

(73) Assignee: Virginia Commonwealth University, Richmond, VA (US)

( * ) Notice: Subject to any disclaimer, the term of this patent is extended or adjusted under 35 U.S.C. 154(b) by 0 days.

(21) Appl. No.: 09/834,763

(22) Filed: Apr. 16, 2001

(65) Prior Publication Data

US 2002/0013042 A1 Jan. 31, 2002

Related U.S. Application Data

(60) Provisional application No. 60/197,681, filed on Apr. 17, 2000.

(51) Int. Cl.$^7$ ............... H01L 29/15; H01L 31/0256
(52) U.S. Cl. ............ 257/76; 257/183; 257/615
(58) Field of Search ............... 438/604, 481; 117/89; 257/17, 76, 183, 615

(56) References Cited

U.S. PATENT DOCUMENTS 6,177,684 B1 * 1/2001 Sugiyama ............ 257/13
6,380,108 B1 * 4/2002 Linthicum et al. ........ 438/791

FOREIGN PATENT DOCUMENTS

| JP | 10-079501 | * 3/1998 | ............ H01L/29/06 |
| JP | 11-354839 | * 12/1999 | ............ H01L/33/00 |

OTHER PUBLICATIONS

Akasaki et al., Effects of AlN Buffer Layer on Crystallographic Structure and on Elecrical and Optical Properties of GaN and Ga sub1–xAl sub x N films continued.*

Grown on Sapphire Substrate By MOVPE, Journal of Crystal Growth, vol. 98, North–Holland Press, Amsterdam, 1989, pp 209–219.*

Freitas, Jr. et al., "Optical and Structural properties of lateral epitaxial overgrown GaN layers" Journal of Crystal Growth, vol. 189/190, Elsevier Press, 1998, pp. 92–96.*

Linthicum K. J. et al. "Process Toutes for Low–Defect Density GaN on Various Substrates Employing Pendeo–Epitaxial Growth Techniques," MRS Internet Journal, Dec. 1999, 7 pages.*

* cited by examiner

Primary Examiner—William David Coleman
(74) Attorney, Agent, or Firm—Whitham, Curtis & Christofferson, P.C.

(57) ABSTRACT

A material with reduced surface defects includes a defect filter layer on an underlying material. The defect filter reduces dislocations and defects present in an underlying material. The defect filter include islands of one material formed on the underlying material and a continuous layer of a second material over the islands. The pair of layers is repeated a plurality of times to reduce the number of defects emanating from the underlying material.

21 Claims, 2 Drawing Sheets

DEFECT REDUCTION IN GAN AND RELATED MATERIALS

The present invention claims priority to U.S. Provisional Patent Application No. 60/197,681, filed on Apr. 17, 2000, herein incorporated by reference in its entirety.

BACKGROUND OF THE INVENTION

1. Field of the Invention

The present invention generally relates to materials with reduced bulk and surface defects and more particularly to GaN layers for optoelectronic materials, electronic materials, and other materials with reduced defects.

2. Background Description

Gallium nitride and its alloys with InN and AlN have recently emerged as important semiconductor materials with applications to yellow, green, blue and ultraviolet portions of the spectrum as emitters and detectors, and as high power/temperature electronics. Estimates are in the billions of dollars per annum for business activity surrounding nitride semiconductor based light emitters and to some extent power devices.

GaN and related heterostructures, however, suffer from a large concentration of structural and point defects. This is due to lack of native substrates being available. The most commonly used substrate is sapphire. There is a large lattice and thermal mismatch between GaN and sapphire. To circumvent this, a process of called "Lateral Epitaxial Overgrowth" is utilized in many instances. This process is imperative in lasers with long longevity. This process requires a growth sequence to be completed. Then the wafer is removed from the reactor, patterned with $SiO_2$ or $Si_3N_4$ and put back in the growth vessel for the continuation of the growth. The post pattern growth process is tailored to promote lateral growth followed by vertical growth after complete coalescence. During lateral growth, the area above the dielectric mask grows out and merges with the one from the other side. Fundamentally, that region of the material will have structural defects unless the GaN below the dielectric mask is coherent. A schematic representation of this process is shown in FIG. 1. As can be seen in FIG. 1, there is shown a cross-sectional view of a portion of a wafer. A GaN layer 1 over a substrate 2 has a $SiO_2$ dielectric mask 3. GaN epitaxy 4 is grown over dielectric mask 3. Defects form in lateral growth wings 5 over the dielectric mask 3. There are still many technological and fundamental problems with this approach and the method is viewed as temporary.

Another approach that has been explored is to grow very thick, 200–300 $\mu$m GaN layers on sapphire by hydride Vapor Phase Epitaxy, remove the GaN layer from the substrate, polish both sides, and fine polish to render the top face epitaxy worthy. With process conditions that have not been reported, one laboratory was able to reduce the extended defect concentration near the top surface. However, the seemingly same approach has not yielded the same success in other laboratories. In any case, this too is a rather involved process.

Nitride semiconductors have been deposited by vapor phase epitaxy (i.e., both hydride VPE (HVPE) which has been developed for thick GaN layers and organometallic VPE (MOVPE) which has been developed for heterostructures), and in a vacuum by a slew of variants of molecular beam epitaxy (MBE).

Nitride-based light emitting diodes (LEDs) with lifetimes approaching 100,000 hours (extrapolated) and brightness near 70 lm/W in the green have been obtained. These LEDs are already being used in full color displays, moving signs, traffic lights, instrumentation panels in automobiles and aircraft, airport runways, railway signals, flashlights, underwater lights. The technology is in the process of being extended to standard illumination under the name "Solid State Lighting" (SSL). SSL is expected to result in substantial energy savings by as much as a factor of six compared to standard tungsten bulbs. Along similar lines, blue lasers are being explored as the read and write light source for increased data storage density for the next generation of digital video disks (DVDs). Already, the room temperature CW operation in excess of 10,000 hours has been reported. To be versatile, this level of lifetime with a power level of about 20 mW at 60 C. is required. The present device lifetimes under these more stringent operating conditions are near 400 hours which is a long way from the needed 10,000 hours.

The large bandgap of GaN with its large dielectric breakdown field, coupled with excellent transport properties of electrons and good thermal conductivity, are well suited for high power electronic devices. Already, high power modulation doped field effect transistors (MODFETs) with a record power density of about 10 W/mm in small devices, and a total power of 8 W in large devices have been achieved. In addition to high power, and high frequency operation, applications include amplifiers that operate at high temperature and other unfriendly environments, and low cost compact amplifiers for earthbound and space applications.

When used as UV sensors in jet engines, automobiles, and coal burning furnaces (boilers), GaN-based devices will allow optimal fuel efficiency and control of effluents for a cleaner environment. Again, this is a direct result of the large bandgaps accessible by nitrides, as well as their robust character. $GaN/Al_xGa_{1-x}N$ (from now on denoted GaN/AlGaN) UV pin detectors have demonstrated sensitivities of about 0.20 A/W or higher, and speed of response below a nanosecond.

Despite this progress, the defect concentrations of both structural and point defects are still high. This is mainly attributed to the lack of native substrates. To circumvent this somewhat, a flurry of activity has been expended on lateral overgrowth methods to block dislocations. However, if and when the base layer lacks long range coherence, the overgrown layer will naturally lack that coherence making it rather doubtful that a defect free material will emerge where the lateral growth fronts meet. Nevertheless, lasers with long longevity could be obtained only by this process as the overall structural defect density is reduced, primarily above the masked regions, by several orders of magnitude to around $10^7$–$10^8$ cm$^{-2}$ from about $10^{10}$ cm$^{-2}$.

For electronic devices to hold promise in a given semiconductor, carrier mobility is generally used as a figure of merit. In addition, the carrier mobility is also used to deduce information regarding scattering centers and processes involved. GaN is no exception and consequently electron mobility in samples prepared by various methods has been a subject of discussion. In this vein, room temperature electron mobilities for MOVPE grown silicon doped GaN layers are typically reported to be in the range of 350–600 cm$^2$V$^{-1}$S$^{-1}$, whereas that reported for hydride vapor phase epitaxy (in several tens of microns thick layers) is about 800 cm$^2$V$^{-1}$ s$^{-1}$. The highest room temperature mobility ever reported for GaN was 900 cm$^2$V$^{-1}$ s$^{-1}$ deposited by MOVPE, which has not been confirmed, for a 4 $\mu$m thick layer. In contrast, the highest room temperature mobility for plasma-MBE grown GaN is around 300 cm$^2$V$^{-1}$ s$^{-1}$ on sapphire substrates and 560 cm$^2$V$^{-1}$ s$^{-1}$ on SiC for ammonia-MBE on sapphire is about 550 cm$^2$V$^{-1}$ s$^{-1}$ in 2 $\mu$m thick layers. More recently, a combination of lateral epitaxial overgrowth by MOCVD and subsequent growth by RF MBE method has resulted in relatively high electron mobilities in GaN, approaching 800 cm$^2$V$^{-1}$ s$^{-1}$. The MOCVD grown layers are several microns thick whereas the MBE grown layers are thin and grown at growth rates in the low tenth of a micron per hour range. These figures compare with earlier predictions, which seemed to have converged around 900 cm$^2$V$^{-1}$ s$^{-1}$. Recently, these predictions had to be revisited as the room temperature mobility in modulation doped AlGaN/GaN structures began to approach about 2,000 cm$^2$V$^{-1}$ s$^{-1}$. Electron mobilities limited by polar optic phonon scattering have been predicted by Ridley to be 2200 cm$^2$V$^{-1}$ s$^{-1}$ for an electron effective mass of m*=0.22 m$_0$.

SUMMARY OF THE INVENTION

The present invention is directed to reducing defects emanating from an underlying material when subsequent layers are added over the underlying material. The invention positions a layer of islands over the underlying material. A barrier layer is then positioned over the layer of islands. The layer of islands and the barrier layer may be repeated a plurality of times. The islands act to separate the barrier layer from the underlying material or the preceding barrier layer and thus reduce the defects of the underlying material from propagating to subsequent barrier layers. In this way, the island layers and the barrier layers make up a defect filter that acts to "filter" the defects in the underlying material. After the appropriate number of alternating island layers and barrier layers have been applied, a final layer may be positioned over the filter.

Accordingly, the present invention includes a material having reduced bulk and surface defects. The material includes a base material having a first surface wherein the first surface has surface defects. A defect filter layer is positioned over the first surface. The defect filter layer includes alternating layers of islands and a barrier layer. The defect filter layer provides a second surface that has a reduced number of defects relative to said first surface. The islands and the barrier layer preferably have different lattice constants. The islands may be made of an island material selected from the group consisting of GaN, AlN, AlGaN, InGaN, and combinations thereof. The island materials and the barrier layer are preferably different from one another and may be selected from the group consisting of GaN, AlN, AlGaN, InGaN, and combinations thereof.

The present invention also includes a GaN material that includes a substrate, a buffer layer on one side of the substrate, and a defect filter layer positioned over the buffer layer. The defect filter layer has a thickness sufficient to reduce defects. Further, the defect filter layer includes at least one layer having a plurality of GaN islands. The defect filter layer preferably includes alternating layers of GaN islands and a barrier layer that has a lattice constant different than GaN. The filter layer material may be selected from the group consisting of AlN, InGaN, AlGaN, and alloys thereof. The number of alternating layers in the filter layer preferably ranges from about 1 to about 50. The defect filter layer preferably has a layer of GaN islands adjacent to the buffer layer.

The buffer layer may include alternating layers of GaN and a material having a lattice constant different than GaN. Further, the material may be a semiconductor. The material may be selected from the group consisting of AlN, InGaN, silicon, AlGaN, and combinations thereof. The number of alternating layers in the buffer preferably ranges from about 1 to about 10. The initial buffer layer preferably begins with a material having a lattice constant different than GaN and ends with a material having a lattice constant different than GaN. The substrate may be selected from the group consisting of sapphire, SiC, ZnO, GaAs, and silicon, and other oxide based substrates such as LiAlO$_2$ and LiGaO$_2$.

The present invention also includes a method for making a GaN material. The method includes growing a buffer layer over a substrate and growing a defect filter layer on the buffer layer to a thickness sufficient to reduce surface defects. The defect filter layer includes a plurality of GaN islands. The step of growing a buffer layer includes growing alternating layers of GaN and a buffer layer material that has a lattice constant different than GaN. The buffer layer material may be selected from the group consisting of AlN, InGaN, silicon, AlGaN, and combination thereof. The step of growing alternating layers in the buffer layer includes repeating the alternating layers of GaN and a material having a lattice constant different than GaN from about 1 to about 10 times. Preferably, the step of growing the buffer layer begins with growing an initial buffer layer of the material having a lattice constant different than GaN and ends with growing a final buffer layer of a material having a lattice constant different than GaN.

The step of growing the defect filter layer includes growing alternating layers of a plurality of GaN islands and a barrier layer having a lattice constant different than GaN. The step of growing alternating layers includes repeating growing alternating layers of a plurality of GaN islands and a barrier layer having a lattice constant different than GaN from about 1 to about 50 times. The step of growing the defect filter layer may include initially growing a layer of GaN islands on the buffer layer and ending the defect filter layer with a barrier layer having a different lattice constant than GaN. The barrier layer may be selected from the group consisting of AlN, InGaN, AlGaN, and alloys thereof. The substrate may be selected from the group consisting of sapphire, SiC, ZnO, GaAs, and silicon, and other oxide based substrates such as LiAlO$_2$ and LiGaO$_2$.

Still further, the present invention includes a semiconductor nitride layer. The semiconductor nitride layer includes GaN islands formed on a material selected from the group consisting of AlN, InGaN, silicon, AlGaN, and combinations thereof. The nitride layer has a surface layer of GaN covering the GaN islands and material.

It is also one object of the present invention to provide a thin GaN layer (about 1 micron) grown on a substrate by molecular beam epitaxy and utilizing a combination of ammonia and RF nitrogen sources to produce a surface with minimal structural defects.

BRIEF DESCRIPTION OF THE DRAWINGS

The foregoing and other objects, aspects and advantages will be better understood from the following detailed description of an embodiment of the invention with reference to the drawings, in which.

DETAILED DESCRIPTION OF THE INVENTION

Figure 1:
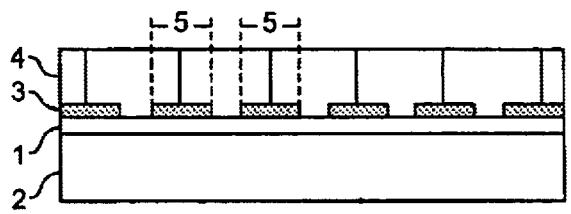
FIG. 1 is a schematic representation of the lateral epitaxial overgrowth process showing the dielectric mask, defects emanating from the GaN layer outside of the masked region, and the defects where the lateral growth wings meet over the dielectric mask.

Generally, the present invention is directed to reducing defects of a material by applying a defect filter to the material. The defect filter preferably utilizes alternating layers of two materials that have different lattice constants. One layer is made of a plurality islands of a first material. The other layer is a barrier layer and is preferably a contiuous layer of a second material that has a different lattice constant than the first material.

As used herein the term "island" or "islands" refers to descrete portions of a material. The term includes, but is not limited to, quantum dots. It should be understood that the size of the islands can vary depending on the level of defect filtering desired and the material being filter. The size of the island may range from about 2 nm to about 50 nm. Further, the term "defect" is understood to include, but should not be limited to, dislocations and structural defects in a bulk material, on a surface of a material, or both.

There are at least three different techniques that may be used to create islands. Typically, the techniques use a reative molecular beam epitaxy system equipped with ammonia or RF excited nitrogen as a nitrogen souce. The following methods for forming islands will be described with respect to a GaN material. These methods are equally applicable to materials other than GaN.

One method grows GaN two dimensionally on a second material that has a different lattice constant than GaN, such as AlN. An interruption scheme is used to cause the GaN to morph into three dimensional growth and form islands on the second material. This method is termed the modified Stranski-Krastanov (modified S-K) growth method. A second method is termed the spray method. This method sprays Ga atoms on the buffer layer followed by morphing it to GaN dots under nitrogen flow. RF nitrogen or ammonia can be used with the spray method. The last described method is termed the Stranski-Krastanov growth method (S-K). Here GaN is grown on a second material to a sufficient thickness at a particular temperature. If parameters are chosen correctly, GaN grows smoothly first followed by balling up, or three-dimensional growth which leads to islands or "dots". The formation of islands can also be accomplished in an MOCVD system or other similar systems, which is based on growth of material from the vapor phase.

The degree of success in the formation of islands depends strongly on the surface on which they are formed. If the surface topology prior to dot formation is not atomically smooth, the topology will interfere with free formation of islands in that islands may form where there are topological features as opposed to forming at or near dislocation sites. This can happen because of reduced strain between the islands as they grow and the underlying layer. Even when the islands form, their shape can be affected by the topology. The goal is to remove topological features to facilitate island formation on or near the defects to the extent possible. To accomplish atomically smooth surfaces, a buffer that contains a series of alternating layers of materials with different lattice constants may be used. Each alternating layer in the buffer may range from about 0.05 to about 4.5 um thick. The thickness values are not critical and can be larger or smaller. The islands may then be formed on the top of this buffer by various methods.

Preferably, island formation is followed by an application of a barrier layer made of a material different from the islands. The pair of layers comprised of the barrier layer and the island or dots layer can be repeated many times. The exact number of times the layers are repeated is not crucial. However, they should be repeated an appropriate number of times to reduce the defects to an acceptable level depending on the material and the application of the material. If too small a number is chosen, the defect filter may not be as effective.

By way of an example of one embodiment of the present invention, the following discussion describes a GaN material that utilizes islands that are in the size range of quantum dots. It should be understood that the present invention is broadly applicable to other materials and other sizes of islands.

In one embodiment of the current invention, alternating layers of GaN quantum dots and AlN barriers are imbedded in the buffer layer of the structure. The quantum dots generally nucleate where the dislocations occur. Dots having very large surface to volume ratio are an excellent medium for bending dislocations and eliminating other defects that are not entirely in intimate contact with the underlying layer which contains defects. In addition, if the dot density is made larger than the dislocation density which is in the range of $10^8$ to $10^{10}$ cm$^{-2}$, many of the dots will not even be on a region containing defects.

Figures 2A, 2B:
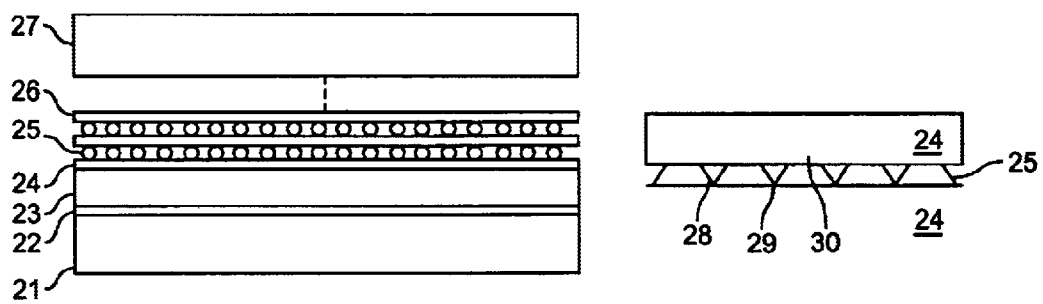
FIG. 2 is a schematic representation of defect reduction by quantum dots, or clusters with similar consequences, imbedded in AlN or AlGaN barrier layers.

The defect filter is schematically shown in FIGS. 2A and 2B. FIG. 2A is a cross-sectional view of a multilayer structure with dots, while FIG. 2B is a magnified view of the dot region indicating how the structural defects can be terminated. A sapphire substrate 21 may be layered with AlN 22 followed by GaN 23 in the buffer layer region. Above GaN 23, AlN or AlGaN barrier layers 24 sandwich GaN dots 25, repeating about 10–50 times in the defect filter region. The final AlN or AlGaN layer 26 is covered with GaN 27. The example used is GaN and related materials on sapphire substrates, but the invention would apply to GaN and related materials on other lattice mismatched substrates such as SiC, ZnO, GaAs, Si and so on.

As shown schematically in FIG. 2B, the defects either terminate at the edges or at the dots as depicted at point 28, they do not propagate into the overlayer as depicted at point 29. In some cases depicted at point 30, they will propagate to the overlayer. Nevertheless, the invention is an effective and less costly approach than competing approaches to reduce defects.

The linewidth broadening as one goes from a single dot to a multitude of dots is due to a distribution in the dot size. It follows that if one can produce dots with a uniform size, the sharp linewidths even for an ensemble of dots will be available.

Even more interesting from a device point of view is that the thermal broadening is significantly reduced relative to higher dimensional systems. The quantum dot problem is the solid state equivalent of a particle in a box. Additional benefits include increased freedom in choosing mole fractions of constituents while maintaining high quality. For example, in coherently strained InGaAs active layered graded index heterostructure clad GRINCH lasers, the maximum wavelength is limited to the range of approximately less than 1.1 $\mu$m. Attempts to increase the wavelength further by increasing the InAs mole fraction leads to defective material, as strain energy exceeds that which causes dislocations to form. In quantum dot or cluster structures, the registry with the underlying layer is reduced and higher mole fractions of InAs can be incorporated without inducing numerous defects, so that intense emission and large absorption at 1.3 μm wavelength is possible. The quantum dot concepts can also be applied to detectors.

Investigations in the GaN system, along the lines of the GaAs system, have been undertaken beginning with reports dating back several years. In one approach, a sub- to monolayer of Si is used. This layer has been touted as an antisurfactant to cause dots to form. However, its exact role is far from clear as indications of Si providing nucleation sites have also been reported. Others suggest that N causes Si to form $SiN_x$ on which GaN would not grow, with an overall result that islandic growth would take place. Other approaches have used an AlN wetting layer, previously referred as barrier layer, which provides a larger lattice mismatch to GaN than AlGaN, and in turn provides a greater impetus for 3-D growth. Also, the surface topology of AlN is smoother which removes the surface features from being the nucleation sites for dots. Dots have also been demonstrated on 6H-SiC and sapphire (0001). Blue-light emission has been reported from such quantum dot structures. By changing the size of the quantum dots, one can in fact tune the color of emission as mentioned earlier.

If periodic dots are prepared, their distributed nature could provide the needed electromagnetic reflections and may lead to reduced dependence on facet (in GaN dots may assume a facetted shape) quality and to reduced ailments associated with carrier recombination at or near facets. In fact, this would be like photonic bandgap structures with the exception that periodic holes etched in the structure in conventional approaches would be replaced with periodic dots. Dots would be better in that they would be buried and non-radiative recombination at the surface would not occur. This would then result in an increased radiative recombination efficiency. Consequently, periodic dots would be much more amenable to device applications as well as clean luminescence experiments. Furthermore, by choosing the spacing of the dots it should be possible in some cases to match the dot separation to half the wavelength of the electromagnetic wave so as to further improve the optical gain in the system.

Quantum dots have also been studied in the silicon/germanium materials system. In this case, quantum dots may be of value for LEDs and photodetectors or in other applications including electronics and semiconductors. In addition, the fact that only two elements are involved offers a simple system to study the growth process and the dot formation. In this system, a Si substrate is employed, and a Si buffer layer is grown, sometimes followed by a Si/Ge relaxed virtual substrate layer. Then, a Si/Ge dot-forming layer is deposited. Self-assembly has been mostly used for the dots but other techniques, such as lithography have also been employed.

Workers have had no greater success in the Si/Ge case than GaAs/InAs in obtaining uniform dot size or separation. In contrast to GaAs/InAs researchers have observed definite faceting of the dots in Si/Ge as expected from SK theory. Thus, both similarities and differences are observed in the two materials systems.

The performance of emitters depends on the compositional inhomogeneities inherent to InGaN, which are not well understood and irreproducible at the very best. Quantum dots have been studied in these materials to circumvent highly unreliable trial and error recipes. Quantum dots are nanometer-sized particles of one material embedded in another material. In the present context, the dots or islands are regions of a smaller energy gap material embedded in a larger energy gap material. Quantum dots will have important implications for the study of nitrides from the scientific point of view and in particular for the optical emitters mentioned above.

Figure 3:
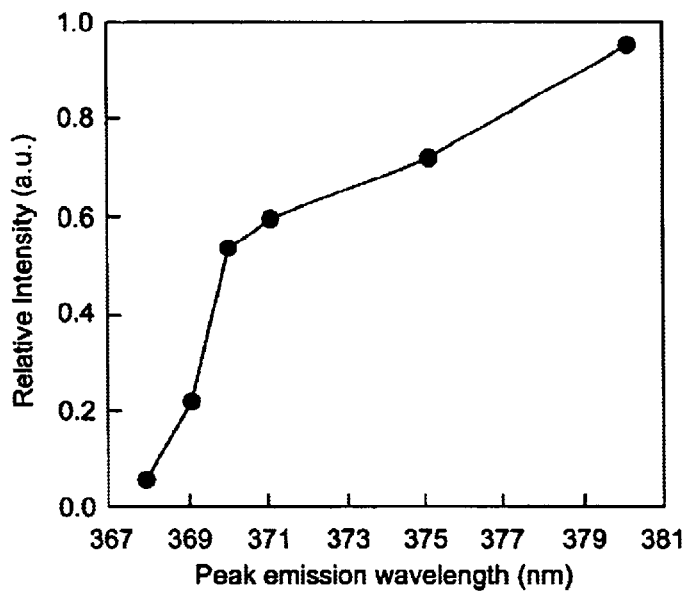
FIG. 3 is a graph comparing relative intensity to peak emission wavelength.

By necessity, GaN is predominantly grown on sapphire substrates and film growth proceeds in twisted and tilted columns. The case on other substrates is to a first approximation similar since none of them is lattice matched. Additional complications, which truly exacerbate the situation, involve InGaN, which forms clusters leading to sizable compositional inhomogeneities. Ironically, somehow the compositional inhomogeneities appear to give rise to efficient light emission. FIG. 3 is a graph comparing relative intensity to peak emission wavelength. It is well known by now that In free active layers do not lead to efficient emission as shown in FIG. 3, where the LED quantum efficiency with respect to wavelength (or InN mole fraction) is shown.

Without InN in the active layers, it has been impossible to achieve lasing action. It is commonly accepted that In rich regions are of higher quality and that these are the regions that dominate the radiative recombination processes. Regions with lower In concentrations would be transparent to the radiation produced by In rich regions providing that the bandtailing effects are not severe. Now, there is no insight into what kind of compositional inhomogeneity is good let alone into the knowledge to reproduce the results of the one and only successful laboratory. A detailed understanding of the crystal growth and the recombination processes involved is a dire need. This would involve investigation of structures that can tolerate lattice mismatch. The best approach is to reduce the tie between the active structure or device and the substrate or the buffer layer. Quantum dots may be used to accomplish this. The idea is that the layer or layers of quantum dots decouple the active layers to be studied from the substrate or buffer layer and, thus reduce number of extended and point defects. This application of quantum dots is novel in that not only the physical processes involving quantum dots, which in their own right are extremely important, can be investigated, but the dots also provide a shunt to the problems imposed by lattice mismatch, and consequently lead to pathways to higher quality material. In addition to the important device applications, having truly high quality material without extended and point defects would allow investigation of the intrinsic properties of this very important material system.

Another twist to the quantum dot case is that proposed by Gérard et al. for reducing the degradation of internal quantum yield. These authors point out that once the carriers are captured by quantum dots, they become strongly localized and their migration toward nonradiative recombination centers is made difficult. Furthermore, the increased localization gives rise to increased radiative recombination rates. In addition, the surface topology of AlN is smoother which removes the surface features from being the nucleation sites for dots. Dots have been demonstrated on 6H-SiC and sapphire (0001). Blue-light emission has been reported from such quantum dot structures. By changing the size of the quantum dots, one can in fact tune the color of the emission.

In the absence of a surface topology driven process, the dots nucleate on dislocations that propagate to the surface of the layer on which they are grown, AlGaN or AlN in the above examples. The key for quality is then to obtain a dot density that is substantially larger than the dislocation density. Preferably, the dislocation density is reduced below $10^8$ cm$^{-2}$ and dot density above $10^{11}$ cm$^{-2}$. This would simply mean that less than one out of every 1000 dots would contain extended defects. The absence of extended defects combined with extreme care in the choice of the growth parameters and their control could lead to dots with extremely small point defect concentration.

Even though, sapphire substrates have been predominantly used for GaN growth. Hardness of the sapphire substrates causes surface damage during the polishing process, which has proven difficult to be removed by chemical etching and/or plasma etching. Such etching serves to expose the sub-surface damage in addition to the surface roughness already present. High temperature annealing in air at 1000, 1100, 1200, 1300, and 1380° C. was employed for 30 and 60 minutes periods to obtain damage free and atomically smooth surfaces. A small, but definite, improvement was observed in reduction of scratches up to 1300° C. as observed by atomic force microscopy (AFM). However, annealing at 1380° C. for 1 hour lead to scratch free and smooth surfaces to the point where the only noticeable feature in AFM images were the atomic steps which are about 0.15 nm in height.

With each higher annealling temperature, the sapphire surface gets progressively, smoother. However, AFM images show the 1380° C. one hour anneal leads to extremely smooth surfaces. Following this procedure, the samples were subjected to a slight chemical etch followed by drying in air in a stainless steel oven at 500° C. prior to insertion in the growth apparatus.

Once in the MBE growth chamber, the sapphire substrate was subjected to a thermal anneal outgassing process at a temperature approaching 1000° C. for 20 min. This was followed by a series of ammonia exposure and RF generated nitrogen exposure. The ammonia exposure was mainly for hydrogen cleaning and the RF process was for nitridation purposes. The RHEED (Reflection High Energy Electron Diffraction) investigations showed the ammonia treatment to help clear the diffraction pattern some more and RF process to cause AlN formation through nitridation. During this process, the RHEED pattern evolves from that for sapphire to that for AlN as determined from rod spacing and 30° rotation of the [112 bar0] azimuth.

Following the nitridation process, about 20 mn of an AlN layer was grown. This was followed by the growth of GaN layer at a temperature, which is typically in the range of about 700–800° C. Various transitional processes were employed from AlN to GaN which ranged from the use of much reduced growth rates, i.e. 50 nm per hour and ammonia with very low flow rates and or RF nitrogen with RF power levels ranging from 100 to 300 W. In all cases, the RHEED quickly recovers and transitions from AlN to GaN over a few nm. The RHEED image of a GaN surface showed a typical 1×1 pattern. The 1×1 pattern gave way to a 2×2 pattern upon cooling the substrate down to about 400° C. with residual nitrogen on the surface.

The two-inch diameter sapphire substrates upon removal from the growth chamber were etched on one edge in a hot solution of sulfuric acid and nitric acid, which selectively etches GaN, for two hours to create a step for thickness measurements by an alpha stepper. X-Ray diffraction measurements were carried out on all samples with a high resolution Philips MRD system for symmetric and asymmetric diffractions. Hall samples in the form of van der Pauw pattern were fabricated using a Ti/Al/Ni/Au metallization followed by a rapid thermal annealing at 900° C. for 30 seconds.

Two sets of samples were grown. In one set bulk GaN layers of about 0.8 to 1.1 microns thick were grown. In the other set, a 0.2 micron thick GaN was grown which was followed by a 10 nm AlN layer at high temperature. This was followed by the growth of 10–20 stacks of GaN quantum dots on AlN barrier layers at a high substrate temperature with one of the three methods described above, including the growth interruption to form the dots. The sample temperature was then lowered to about 700–800° C. and growth of GaN resumed to a total thickness of 0.8 to 1.1 microns. The sample temperatures used are process dependent. With a different set of growth parameters, the temperature would be different. However, the concepts discussed would remain in effect.

In preparing one embodiment of the inventive material, a modified S-K growth method was used. Quantum dots were created with a reactive MBE system equipped with ammonia or RF excited nitrogen as the nitrogen source. Several monolayers of GaN were grown in the 2D regime at low temperatures and followed by formation of the dots by annealing at higher temperatures. This process would be continued for however many layers of quantum dots desired. Computer control can provide the precision needed to attain the same dot size from one layer to the next.

In another embodiment of the present invention, the samples were grown on c-plane sapphire substrates by molecular beam epitaxy. Other techniques such as organo-metallic chemical vapor phase epitaxy can also be used. However, the as-received sapphire substrates suffer from mechanical chemical polish damage. A series of steps were taken to not only clean the sapphire surface, but also eliminate the damage. Sapphire substrates preferably undergo a chemical (solvent) cleaning procedure. This is followed by the substrate being dipped in a solution of TriChloroEthane (TCE) and kept at 300° C, for 5 minutes. The substrate is then rinsed for 3 minutes each in acetone and methanol. This procedure is followed by a 3-minute rinse in deionized (DI) water. The above steps are repeated three times to complete the degreasing process.

Following the degreasing procedure, the surface damage is removed by chemical etching. A 3:1 solution of hot $H_2SO_4$:$H_3PO_4$ (300° C.) is then used for 20 minutes to remove some of the surface material. This is followed by a rinse in DI water for 5 minutes. This procedure serves to remove the very surface damage but does not lead to smooth surfaces. To remove the scratches and other deeper damage, sapphire substrates were subjected to a high temperature heat-treatment in air (about 1400° C.) and for one hour. Sapphire substrates subjected to this high temperature heat treatment exhibit very smooth morphology as determined by atomic force microscopy (AFM) images. These images show terrace-like features with about 0.2 micrometer long terraces. The terrace structure could facilitate smooth 2D growth and reduce column formation during the growth of GaN epilayers other than those caused by the lattice mismatch. Following this process, the sapphire surface is preferably chemically cleaned again to remove any contaminants acquired during the high temperature annealing process. This may be followed by a 500° C. anneal in a stainless steel oven in air to remove water vapor.

In another embodiment of the present invention, sapphire substrates were loaded into an MBE system which has ammonia and radio frequency activated nitrogen source for N. The substrates were heated to about 900–1000° C. and reflection high energy electron diffraction system used to observe and verify a clean sapphire surface. Following this confirmation, the surface was subjected to a 5–15 min ammonia bath at a flow rate of 5–30 sccm for additional cleaning, reduction by H, and possible nitridation of the surface in which the sapphire surface is converted to AlN. The main nitridation process was done with the RF nitrogen source in the temperature range of 900–1000° C. for 10–30 min, with RF parameters being 300–325 W and system pressure of mid $10^{-5}$ Torr. This was followed by growth of a 20–40 nm thick AlN buffer layer. The RF conditions were similar to nitridation conditions except that the nitrogen flow rate was reduced by about 20%. The temperature of deposition however was varied between 500 and 1000° C. The low temperature buffer layers leading to smoother surface, but X-Ray diffraction and post GaN growth experiments indicated the high temperature buffer layers to be better in quality.

On AlN buffer layers, a 0.3 to 0.5 micron thick GaN film was grown by RF nitrogen at a substrate temperature in the range of 700 to 800° C. while assuring, by RHEED, smooth surface morphology. The RF power was 300 W, though values as low as 90 W was employed, and the system pressure was about 1.5 to $2.5\times10^{-5}$ Torr, depending the Ga temperature and substrate temperature employed. The goal was to obtain smooth surfaces. Higher substrate temperature required higher Ga temperatures and or lower nitrogen overpressure to get smooth and Ga terminated GaN surfaces. The growth rate employed, which was determined by nitrogen overpressure, was typically 0.4 micron per hour. On top of this GaN layer, an AlN layer of sufficient thickness to relax (about 10 nm or greater) at 850–950° C., again making sure that the surface is smooth as determined by AFM images. Both ammonia and RF generated nitrogen source were employed. The nitrogen flow condition and RF power were similar to the first buffer layer when RF activated nitrogen was used. When ammonia was used, a flow rate range of 6–30 sccm was employed. The purpose of this buffer layer is to change the lattice constant of the template from that of GaN to that of AlN which is about 4% smaller. This smaller lattice constant when followed by the larger lattice constant GaN strains the GaN which is in turn the driving force for making the GaN to ball up. This procedure is an example of the Stranski-Krastanov growth method described earlier.

The next series of layers (10 periods in our case) involve growth of pairs of GaN and AlN which were grown with ammonia at a flow rate of 30 sccm, though other flow rates could be used, at a substrate temperature in the range of 870–960° C. The GaN layers were grown in the thickness range of 5 to 10 monolayers (about 1.4 to 2.8 nm in thickness). This thickness range overlaps with relaxation or critical thickness. At much lower temperatures, the reported data indicate that GaN layers tend to three dimensional growth after a short two dimensional nature (Stranski-Krastanov growth mode). However, the dots do not exhibit high quality optical response. Consequently, a much higher temperature and a modified Stranski-Krastanov growth mode was used. In this approach, a GaN layer, which must be thicker than the critical thickness, is grown and the growth is interrupted. During the interruption, the two dimensional growth is forced to three-dimensional growth. Interruption periods may be anywhere from 15 seconds to 2 minutes. The interruption period was followed by the deposition of AlN in the thickness of about 10 nm. This process is repeated 10 times, meaning GaN growth on AlN, interruption for 3-D formation, and AlN growth.

Figure 4:
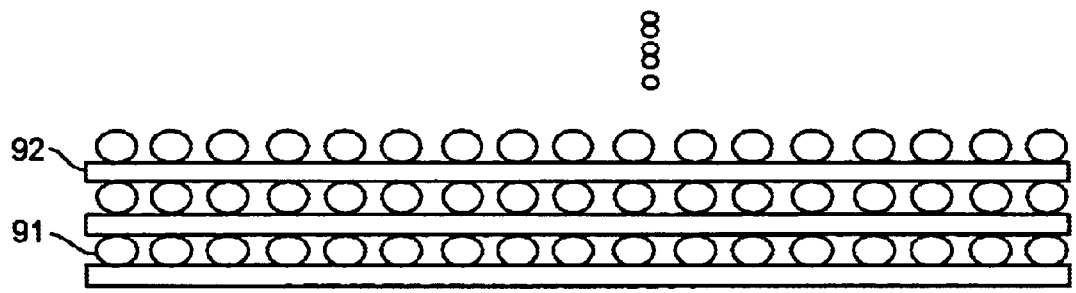
FIG. 4 is a schematic of a cross-sectional view of a GaN quantum dots layered with AlN.

Following the stack of AlN and GaN layer growth, the growth temperature was reduced to 750° C. for growth of thick GaN layers in the case of RF. In the case of ammonia growth, the growth temperature was kept the same as that employed for the AlN/GaN stack. A schematic representation of a the structure grown is shown in FIG. 4, where GaN dots 91 are layered with a barrier layer of AlN 92 repeating in 10–50 pairs of layers. This is a magnified version of that which is shown in FIG. 2A.

Figure 5:
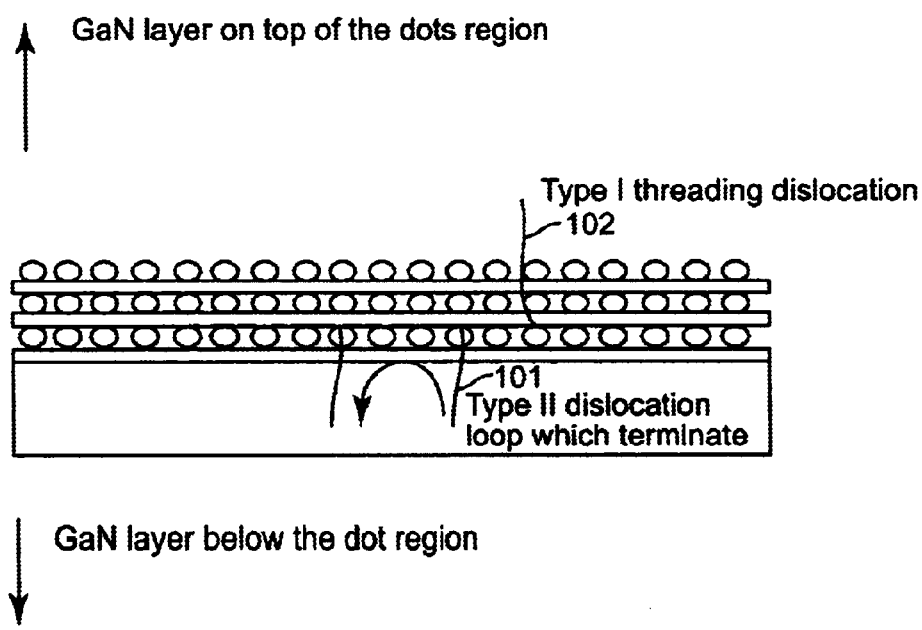
FIG. 5 is a schematic of a cross sectional view depicting dislocation.

Defect reduction in the top GaN layer, shown in FIGS. 2A and 2B, is believed to be due to dislocation looping as shown in FIG. 5. It is typical that not all the dislocations would loop. For the sake of discussion, we call those that loop as type II, shown as item 101, and those that do not loop are designated as type I, shown as item 102. The looping dislocation have an in plane component and along it one half plane would be missing.

In an effort to illustrate that quantum dots in a defect filter can filter defects emanating from substrates, x-ray diffractions studies were performed. Materials with sapphire substrates were removed from the growth chamber and etched on one edge in a hot solution of sulfuric acid and nitric acid, which selectively etches GaN, for two hours to create a step for thickness measurements by an alpha stepper. X-Ray diffraction measurements were carried out on all samples with a high resolution Philips MRD system for symmetric and asymmetric diffractions. Hall samples in the form of van der Pauw pattern were fabricated using a Ti/AlNi/Au metallization followed by a rapid thermal annealing at 900° C. for 30 seconds. Low temperature (10) PL measurements were carried out in a closed cycle dewar using a HeCd laser as the excitation source and photon counting for signal collection. Finally, AFM measurements were carried out with a digital nanoscope III system for surface morphology analysis.

AFM images for a sample with and another sample without the quantum dot layer were obtained. The sample with quantum dots shows a surface that is much more improved than the sample without dots. The images show pits having a density of which is about afew $10^8$ cm$^{-2}$ due to incomplete coalescence of the dots. This is indicative of the fact that the samples are grown near the Ga rich conditions as evidenced by the growth rate being limited by nitrogen flux. The pits can be eliminated by increased Ga flux, or reduced substrate temperature, or reduced growth rate by lowering the nitrogen flux. The surface morphology of the samples without dots is very different and does not necessarily lend itself to smooth surfaces.

The X-ray data are interesting in that the symmetric diffraction peak in samples with and without quantum dots are relatively close although those with dots are sharper. Typical values are about 2 arc minutes with most recent samples indicating close to 100 arc seconds. An asymmetric peak, however, distinctly shows that the samples with quantum dots, where growth parameters were well controlled, have much sharper diffraction peaks. The histograms of both peaks for some 35 samples were obtained and corroborate the premise that dots do improve the asymmetric diffraction. In simple terms, this is indicative of how parallel the c-planes are as one goes towards the surface. The asymmetric peak, however, is very sensitive to in plane microstructure and sharp peak widths generally imply reduced structural defects. One can then conclude that the samples with quantum dots have better structural properties than without.

X-ray diffraction peaks are much sharper with the use of quantum dots. In addition, atomic force microscopy images indicate atomically smooth surfaces to be obtained with dots. These results in their totality indicate that the quantum dots imbedded in GaN filter the defects, which emanate from substrates which are not native to GaN. This method is expected to overcome the notorious problem of defect propagation from the substrate-epi interface to the rest of the epitaxial layers and is much simpler than the epitaxial lateral overgrowth process.

Optical and Structural quality of layers grown with and without quantum dot defect filters have also been investigated to interrogate the efficacy of the quantum dot approach. The optical quality was probed by photoluminescence (PL) and the structural quality germane to this particular investigation is based on X-ray diffraction.

The PL method takes advantage of the fact that most point defects emit light with specific photon energies after they capture nonequilibrium carriers. The intensity of PL from different defects depends on concentration of the particular defect and its capture cross-section. Thus, in n-type semiconductor nonequilibrium holes (which are minority carriers) are captured by acceptors with a rate proportional to the acceptor concentration and its hole cross-section. Since the capture rate is typically much faster than the recombination rate, PL intensity is proportional to the capture rate. The "lifetime" of PL may be found from transient PL measurements.

Capture cross-section can be estimated from the temperature dependence of the PL intensity, since quenching of PL with temperature, which is related to thermal escape of holes to the valence band (in n-type), depends on the holes capture cross-section and position of the defect energy level. Concentration of the defect may be estimated from the dependence of PL intensity on excitation rate. Indeed, the PL intensity increases linearly with excitation rate until the product of the capture rate (which in turn is the product of excitation rate by the quantum efficiency of the PL via the defect involved) and the PL lifetime exceeds concentration of the defect. At a higher excitation rate the PL intensity saturates.

The shape of the defect photoluminescence (PL) spectrum depends on the position of the defect energy level in the gap as well as on the strength of coupling with different phonon modes. Usually, the deeper the defect stronger the electron-phonon interaction. The strength of the coupling (which is characterized by the Huang-Rhys factor) and energies of the vibrational modes can be found from analysis of the PL band shape and its variation with temperature. Among vibrational modes, the lattice or defect modes may dominate. A practical issue is that interaction of the defect with phonons should not depend on the sample history. Therefore, the shape of the defect PL band including phonon replicas describes the defect. Besides, defects with the strong electron-phonon interaction are characterized by different equilibrium position in the lattice when they bind a carrier and lose it. As a result, position of the energy level of such defect relative to the conduction or the valence bands is different in different experiments (optical and thermal). The configuration coordinate diagrams for the defect can be constructed from the results of PL and PL excitation spectra data. These diagrams can explain many properties of defects including their metastable behavior.

Critical information may be obtained from the PL behavior under application of hydrostatic or uniaxial pressure to the crystal. The shift of the PL band with the pressure depends on deformational constants, which are different for different defects. The pressure experiments aid in the revelation of the DX-type centers. Uniaxial pressure PL is a powerful tool for study of anisotropic defects, which can reorient with application of external fields. Also useful in analyzing the optical signature of defects are methods which employ resonant excitation of defects by polarized light (polarization diagrams method).

Some of the PL bands arise from the donor-acceptor pair (DAP) type transitions. Peculiarities of DAP type transitions (characteristic shifts of the DAP-type bands with excitation intensity and with temperature) help to identify the nature of defects and find energy positions of the defect levels without the Coulomb interaction which may change them dramatically. Another issue to be cognizant of is that a high concentration of defects (when semiconductor is intentionally doped) often leads to large potential fluctuations, which in turn greatly affect the properties of the semiconductor under investigation. PL is also an efficient tool for revealing and describing these fluctuations.

The photoluminescence spectra for three GaN layers, which have been grown under the same conditions over a period of nearly a year were obtained. Layer 451 contained a standard AlN layer buffer layer on sapphire before the growth of the GaN layer. Layer 455 contained an AlN buffer layer followed by GaN and a set of GaN/AlGaN multiple-quantum wells. Layer 452 and 750 contained AlN and GaN buffer layers and quantum dot filtering layer. Quantum wells have been reported to improve the quality of layers. A comparative study here with quantum wells was included just to make sure that the effect of quantum dots is delineated from the quantum wells.

The spectra showed that layers 452 and 750 have cleaner spectra that are void of extrinsic transitions in the energy range of 3.1 to 3.45 eV. The transitions in this region are generally associated with point defects and impurities. The peaks appearing in layers 452 and 750 are due to phonon replicas of the intrinsic transitions and are characterized by their separation (optical phonon energy of about 92 meV) and decreasing intensity with reducing energy. The quantum dots formed for layer 452 were done by the modified S-K method. The quantum dots for layer 750 were done with the S-K method.

X-ray diffraction is indicative of structural properties such as dislocations. A specific threading dislocation geometry will lead to distortions of only specific crystallographic planes. Edge dislocations distort only (hkl) planes with either h or k non-zero. Rocking curves for off-axis (hkl) planes (asymmetric such as the (104) diffraction we obtained) are broadened, while symmetric (001) rocking curves (such as (002) that we obtained) are insensitive to pure edge threading dislocation content in the film. Screw threading dislocations with [001] direction have a pure shear strain field that distort all (hkl) planes with l non zero. Therefore the rocking curves widths for off-axis reflections are a more reliable indicator of the structural quality of GaN films. The in-plane structure is more closely related to electron mobility and optical properties than those in the plan-normal direction, suggesting that asymmetric diffraction, as opposed to out of plane diffraction should be weighed more heavily.

A crystallographic analysis by high-resolution x-ray diffraction rocking curves (omega scans) for three different samples were obtained. All three samples represent GaN layers grown under identical conditions except their buffer layers. Sample 451 was simply a GaN layer grown on an AlN buffer layer. Sample 455 was GaN, identical to that in sample 750 but grown on AlGaN/GaN multiple quantum wells which are in turn on GaN deposited on an AlN buffer layer.

Sample 750 was GaN which was identical to the previous two except it was grown on quantum dot filters. A narrow (10–14) peak in sample 750 was observed and is indicative of the fact that the threading pure edge dislocations have been reduced in concentration. This is consistent with the defect delineation etching method described earlier. A narrow (0002) peak was observed and is indicative of the fact that the screw dislocation density is low. The (0002) reflection for sample 750 was obtained and was analyzed with curve fitting analysis to garner information about the GaN layers present in the composite.

The curve-fitting with three Gaussian distributions replicates the overall spectra extremely well. These three contributions are attributed to the three GaN layers present in the film. The widest one was associated with the first GaN as this film contains the most defects. The narrowest one, 0.85 arcmin, was due to the top GaN grown on the quantum dot filters. The other one is attributed to the middle GaN layer. The figures of 0.85 and 1.96 arc min for (0002) and (10–14) peaks in layer 750 which is only about 2 $\mu$m thick are unmatched as a pair.

In order to gain a comparative view of layer 750, which contained quantum dots filters, X-ray data, in addition to those of sample 750, from two layers grown by Hydride Vapor Phase Epitaxy were obtained. HVPE sample is a 10 $\mu$m thick layer on sapphire. Samsung sample is a 200 $\mu$m thick freestanding GaN template. As the data indicate, sample 750 which is about 2 $\mu$m in thickness, compares very well with the free standing GaN template. It should be pointed out that the thicker the layers, the narrower the X-ray data in HVPE samples as dislocations tend to annihilate one another, by looping for example, as the film thickness is increased. Thicker layers are more expensive to produce and can not be done to the same extend possible by HVPE, by MOCVD and MBE regardless of the cost. HVPE can not prepare heterojunctions which means that it can not be used to prepare the device structures.

The comparative X-ray data inclusive of all the layers are presented in Table I. These are sample 451 grown on AlN buffer, 455 grown on AlGaN/GaN buffer layer, 750 grown on quantum dot layer. In addition, two samples, one grown by HVPE to a thickness of 10 $\mu$m and the other grown by HVPE to a thickness of 300 $\mu$m, were laser separated, polished and etched down to a thickness of about 200 $\mu$m. Sample 750 which is only about 2 $\mu$m thick. It should be pointed out that thicker the film, the stronger the [104] peak is. The Samsung template was bowed. Therefore, narrow slit widths were used to circumvent the resultant widening of the diffraction peaks, which reduced the intensity.

TABLE I

X-ray data for the three types of MBE layers, a HVPE layer and a template.

| | [002] | | [104] | | |
|---|---|---|---|---|---|
| Sample # | FWHM (arcmin) | Intensity (cps) | FWHM (arcmin) | Intensity (cps) | comments |
| SVT451 | 12.1 | 13200 | 8.8 | 500 | |
| SVT455 | 12.1 | 12100 | 9.18 | 500 | |
| SVT750 | 1.99 | 75000 | 1.97 | 3700 | 2. 1 $\mu$m |
| HVPE98 | 5.8 | 161000 | 3.9 | 18400 | thickness ~ 13 $\mu$m |
| SamSung | 1.15 | 45* | 1.72 | 70* | Ga-face slit = 0.02 mm for [002] slit = 0.1 mm for |

TABLE I-continued

X-ray data for the three types of MBE layers, a HVPE layer and a template.

| | [002] | | [104] | | |
|---|---|---|---|---|---|
| Sample # | FWHM (arcmin) | Intensity (cps) | FWHM (arcmin) | Intensity (cps) | comments |
| SVT750 | 0.87 | | | | [104] Top layer |
| SVT750 | 1.06 | | | | Intermediate layer |
| SVT750 | 3.58 | | | | Bottom layer |

While the invention has been described in terms of its preferred embodiments, those skilled in the art will recognize that the invention can be practiced with modification within the spirit and scope of the appended claims.

What is claimed is:

1. An article with reduced surface defects comprising:
   a substrate
   a buffer layer on one side of said substrate;
   a plurality of defect filter layers on said buffer layer wherein each said defect filter layer has a thickness sufficient to reduce surface defects and wherein said defect filter layer comprises at least one layer having a plurality of GaN self-assembled islands; and
   a defect sensitive device fabricated on the defect filter layer.

2. The GaN material of claim 1 wherein the defect filter layer further comprises alternating layers of GaN self-assembled islands and a barrier layer having a lattice constant different than GaN.

3. The GaN material of claim 2 wherein said barrier layer is selected from the group consisting of AlN, InGaN, AlGaN, and combinations thereof.

4. The GaN material of claim 2 wherein the number of alternating layers ranges from about 1 to about 50.

5. The GaN material of claim 2 wherein said defect filter layer has a layer of GaN self-assembled islands adjacent to said buffer layer.

6. The GaN material of claim 1 wherein said buffer layer comprises alternating layers of GaN and a material having a lattice constant different than GaN.

7. The GaN material of claim 6 wherein said material having a lattice constant different than GaN is a semiconductor.

8. The GaN material of claim 6 wherein said material having a lattice constant different than GaN is selected from the group consisting of AlN, InGaN, silicon, and AlGaN.

9. The GaN material of claim 6 wherein said number of alternating layers ranges from about 1 to about 10.

10. The GaN material of claim 6 wherein the initial buffer layer begins with said material having a lattice constant different than GaN and ends with said material having a lattice constant different than GaN.

11. The GaN material of claim 2 wherein said substrate is selected from the group consisting of sapphire, SiC, ZnO, and silicon.

12. A semiconductor nitride layer comprising:
   self-assembled GaN islands formed on a material selected from the group consisting of AlN, InGaN, silicon, and AlGaN and wherein said nitride layer has a surface layer of GaN covering the GaN islands and said materials, said self-assembled GaN islands positioned between at least two barrier layers; and a defect sensitive device fabricated on the surface layer of GaN.

13. A material having reduced surface defects comprising:
a base material having a first surface wherein the first surface has surface defects;
a detect filter layer on said first surface wherein said defect filter layer comprises alternating layers of self-assembled islands and barrier layers and wherein said defect filter layer provides a second surface having a reduced number of surface defects relative to said first surface; and
a defect sensitive device fabricated on the second surface.

14. The material of claim 13 wherein said islands and said barrier layers have different lattice constants.

15. The material of claim 13 wherein said islands are made of an island material selected from the group consisting of GaN, AlN, AlGaN, InGaN, and combinations thereof.

16. The material of claim 13 wherein the island materials and the barrier layer are different from one another and are selected from the group consisting of GaN, AlN, AlGaN, InGaN, and combinations thereof.

17. An article having reduced surface defects comprising:
a material having a surface with defects;
a plurality of defect filter layers positioned over said substrate wherein each said defect filter layer has at least one layer of self-assembled islands positioned over said material and at least one barrier layer positioned over said self-assembled islands;
a final layer positioned over said defect filter, the final layer having reduced defects compared to said material; and
a defect sensitive device fabricated on the final layer.

18. The article of claim 17 wherein the defect sensitive device is selected from the group consisting of an LED, a semiconductor, a laser, and a photoelectronic device.

19. A GaN device, comprising:
a GaN substrate;
a second substrate; and
a defect filter layer positioned between said GaN substrate and said second substrate, said defect filter layer having a plurality of alternating continuous barrier layers and discontinuous island layers comprising self-assembled islands, said defect filter layer reducing defects on a surface of said GaN substrate; and
a defect sensitive device fabricated on the GaN substrate.

20. The GaN device of claim 19 further comprising a buffer layer positioned between said GaN substrate and said defect filter layer.

21. The GaN device of claim 19 wherein said discontinuous island layers in said defect filter layer include a plurality of GaN dots.

* * * * *